(12) United States Patent
Kimura

(10) Patent No.: US 9,464,192 B2
(45) Date of Patent: Oct. 11, 2016

(54) ADDITION-CURABLE SILICONE COMPOSITION, OPTICAL DEVICE ENCAPSULATING MATERIAL AND OPTICAL DEVICE

(71) Applicant: SHIN-ETSU CHEMICAL CO., LTD., Tokyo (JP)

(72) Inventor: Shinji Kimura, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/654,974

(22) PCT Filed: Nov. 28, 2013

(86) PCT No.: PCT/JP2013/006996
§ 371 (c)(1),
(2) Date: Jun. 23, 2015

(87) PCT Pub. No.: WO2014/108954
PCT Pub. Date: Jul. 17, 2014

(65) Prior Publication Data
US 2015/0344691 A1 Dec. 3, 2015

(30) Foreign Application Priority Data
Jan. 10, 2013 (JP) ................. 2013-002950

(51) Int. Cl.
| | |
|---|---|
| *C08L 83/04* | (2006.01) |
| *G02B 1/04* | (2006.01) |
| *H01L 33/56* | (2010.01) |
| *H01L 23/29* | (2006.01) |
| *C08G 77/12* | (2006.01) |
| *C08G 77/14* | (2006.01) |
| *C08G 77/20* | (2006.01) |
| *C08G 77/00* | (2006.01) |

(52) U.S. Cl.
CPC ............ *C08L 83/04* (2013.01); *G02B 1/04* (2013.01); *H01L 23/296* (2013.01); *H01L 33/56* (2013.01); *C08G 77/12* (2013.01); *C08G 77/14* (2013.01); *C08G 77/20* (2013.01); *C08G 77/80* (2013.01); *C08L 2201/02* (2013.01); *C08L 2201/10* (2013.01); *C08L 2203/206* (2013.01); *H01L 2224/45144* (2013.01); *H01L 2224/48091* (2013.01); *H01L 2224/48247* (2013.01); *H01L 2224/73265* (2013.01)

(58) Field of Classification Search
CPC ....... C08G 77/12; C08G 77/20; C08L 83/00; B01J 23/40
See application file for complete search history.

(56) References Cited

U.S. PATENT DOCUMENTS

| | | | |
|---|---|---|---|
| 2006/0073347 A1 | 4/2006 | Morita et al. | |
| 2007/0112147 A1 | 5/2007 | Morita et al. | |
| 2009/0179180 A1* | 7/2009 | Morita ................... | C08L 83/04 252/501.1 |
| 2011/0269918 A1 | 11/2011 | Hamamoto et al. | |
| 2012/0056236 A1 | 3/2012 | Hamamoto et al. | |

FOREIGN PATENT DOCUMENTS

| | | |
|---|---|---|
| CN | 102234431 A | 11/2011 |
| CN | 102399446 A | 4/2012 |
| CN | 102532915 A | 7/2012 |
| CN | 102585510 A | 7/2012 |
| JP | 2004-033524 A | 2/2004 |
| JP | 2004-143361 A | 5/2004 |
| JP | 2004-292807 A | 10/2004 |
| JP | 2005-076003 A | 3/2005 |
| JP | 2005-105217 A | 4/2005 |
| JP | 2010-132795 A | 6/2010 |
| JP | 2011-246693 A | 12/2011 |
| JP | 2012-052035 A | 3/2012 |
| JP | 2012-052045 A | 3/2012 |
| JP | 2012-126834 A | 7/2012 |

OTHER PUBLICATIONS

Jan. 21, 2014 International Search Report issued in International Patent Application No. PCT/JP2013/006996.
Jul. 1, 2016 Search Report issued in Chinese Application No. 2013800698661.

* cited by examiner

*Primary Examiner* — Kuo-Liang Peng
(74) *Attorney, Agent, or Firm* — Oliff PLC

(57) ABSTRACT

An addition-curable silicone composition includes: a three-dimensional network organopolysiloxane having at least one alkenyl group and at least one aryl group in one molecule, having a siloxane unit represented by the following general formula, $R_2SiO$, and $SiO_2$, and not having a unit represented by $RSiO_{3/2}$, wherein R represents an organic group; a linear organopolysiloxane having at least two alkenyl groups and at least one aryl group in one molecule; an organosilicon compound having at least two hydrogen atoms bonded to silicon atoms per one molecule, and not having an alkenyl group; and a hydrosilylation catalyst containing a platinum group metal. Thereby, there can be provided an addition-curable silicone composition which provides a cured product having high refractive index, transparency, and temperature cycling resistance, an optical device encapsulating material, and an optical device which is encapsulated with the optical device encapsulating material.

18 Claims, 1 Drawing Sheet

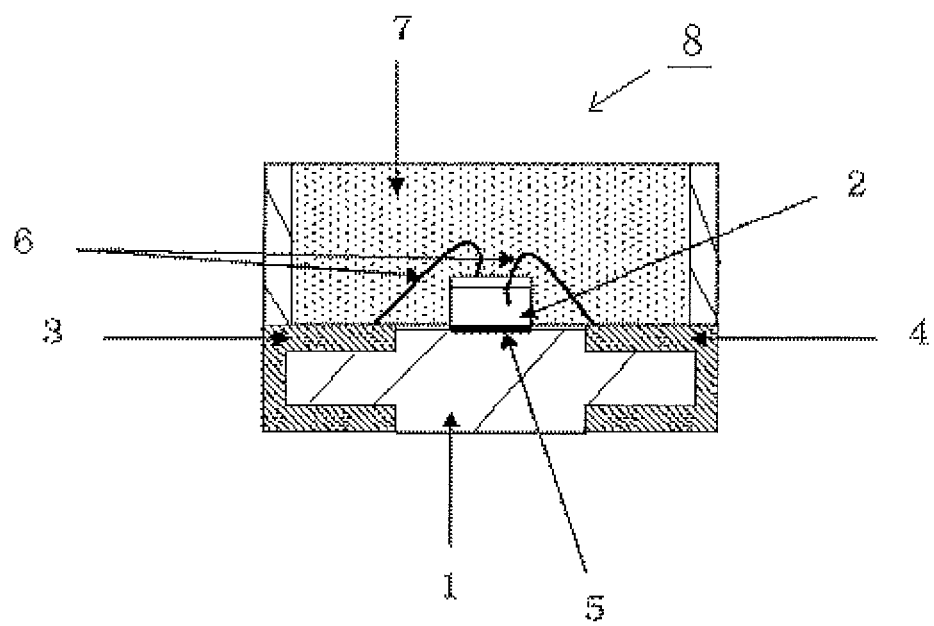

ADDITION-CURABLE SILICONE COMPOSITION, OPTICAL DEVICE ENCAPSULATING MATERIAL AND OPTICAL DEVICE

TECHNICAL FIELD

The present invention relates to an addition-curable silicone composition, and an optical device encapsulating material and an optical device by using the same.

BACKGROUND ART

An addition-curable silicone composition includes an organopolysiloxane containing an aliphatic unsaturated group such as an alkenyl group to provide a cured product by being cured by a hydrosilylation reaction. A cured product to be thus obtained is excellent in heat resistance, cold resistance and electric insulation, and due to its transparent appearance, it is used for various optical purposes.

Since a silicone cured product used for optical purposes requires higher transparency and refractive index, a method for using a linear organopolysiloxane having an aryl group such as a phenyl group in a main skeleton is conventionally used to satisfy these requirements (Patent Literatures 1 and 2).

Toward achieving higher hardness, a composition including a branched organopolysiloxane having a unit represented by $RSiO_{3/2}$, wherein R represents an organic group is used (Patent Literatures 3 to 5).

However, the above types of curable organopolysiloxane compositions are prone to such problems as insufficient temperature cycling resistance, peeling from a substrate and crack generation of a cured product obtained by curing each composition.

CITATION LIST

Patent Literature

PATENT LITERATURE 1: JP-A-2004-292807
PATENT LITERATURE 2: JP-A-2010-132795
PATENT LITERATURE 3: JP-A-2005-076003
PATENT LITERATURE 4: JP-A-2004-143361
PATENT LITERATURE 5: JP-A-2005-105217

SUMMARY OF THE INVENTION

Technical Problem

The present invention was made in view of the above situation, and has an object to provide an addition-curable silicone composition which provides a cured product having high refractive index, transparency, and temperature cycling resistance, an optical device encapsulating material comprising the composition, and an optical device which is encapsulated with the optical device encapsulating material.

Solution to Problem

To solve the problems as mentioned above, the present invention provides an addition-curable silicone composition comprising:
A. a three-dimensional network organopolysiloxane having at least one alkenyl group and at least one aryl group in one molecule, having a siloxane unit represented by the following general formula, $R_2SiO$, and $SiO_2$, and not having a unit represented by $RSiO_{3/2}$,
wherein R represents an organic group;
B. a linear organopolysiloxane having at least two alkenyl groups and at least one aryl group in one molecule;
C. an organosilicon compound having at least two hydrogen atoms bonded to silicon atoms per one molecule, and not having an alkenyl group, in an amount enough to cure the composition in the presence of a hydrosilylation catalyst described below; and
D. the hydrosilylation catalyst containing a platinum group metal.

Accordingly, if the component A is a three-dimensional network organopolysiloxane having a siloxane unit comprising a unit D ($R_2SiO$) and a unit Q ($SiO_2$) and not having a unit T ($RSiO_{3/2}$), an addition-curable silicone composition which provides a cured product having high refractive index, transparency, and temperature cycling resistance.

In the present invention, the component A is preferably a three-dimensional network organopolysiloxane represented by the following average composition formula, $$(R^1{}_3SiO_{1/2})_a(R^1{}_2SiO)_b(SiO_2)_c \qquad (1)$$

wherein $R^1$ independently represents an organic group; at least 1 mole % of all the $R^1$ is an alkenyl group; at least 10 mole % of all the $R^1$ is an aryl group; "a" represents 0 or a positive number; and "b" and "c" each represent a positive number, satisfying $0.1 \leq \text{"b"}/(a+b+c) \leq 0.8$, and $0.25 \leq \text{"c"}/(a+b+c) \leq 0.8$.

In addition, the component B is preferably a linear organopolysiloxane represented by the following average composition formula, $$(R^2{}_3SiO_{1/2})_d(R^2{}_2SiO)_e \qquad (2)$$

wherein $R^2$ independently represents an organic group; at least 0.1 mole % of all the $R^2$ is an alkenyl group; at least 10 mole % of all the $R^2$ is an aryl group; and "d" and "e" each represent a positive number, satisfying $0.001 \leq \text{"d"}/(d+e) \leq 0.7$.

Also, the component C is preferably an organopolysiloxane represented by the following average composition formula, $$(R^3{}_3SiO_{1/2})_f(R^3{}_2SiO)_g(R^3SiO_{3/2})_h \qquad (3)$$

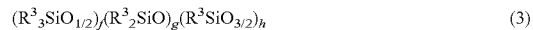

wherein $R^3$ represents an identical or different organic group or a hydrogen atom other than an alkenyl group; 0.1 to 50 mole % of all the $R^3$ is a hydrogen atom; 10 mole % or more of all the $R^3$ is an aryl group; "f" represents a positive number; and "g" and "h" each represent 0 or a positive number, satisfying $0.01 \leq \text{"f"}/\text{"g"} \leq 2$, wherein "g" represents a positive number, $0.1 \leq \text{"f"}/\text{"h"} \leq 3$, wherein "h" represents a positive number, and $0.01 \leq \text{"f"}/(f+g+h) \leq 0.75$.

Accordingly, if a composition includes the above components A, B and C of the present invention, the composition can be an addition-curable silicone composition which provides a cured product having much higher refractive index, transparency, and temperature cycling resistance.

Preferably, the amount of the component B is a mass ratio of 0.01 to 100, relative to the component A, and the amount of the component C is a mass ratio of 0.01 to 100, relative to the total of the components A and B.

Since an addition-curable silicone composition having the above mass ratios provides a cured product obtained by being cured having assuredly high refractive index, transparency, and temperature cycling resistance, it can more preferably be used as an optical device encapsulating material.

The present invention also provides an optical device encapsulating material comprising the composition.

Since a cured product obtained by curing the composition has high refractive index, transparency, and temperature cycling resistance, it can preferably be used as an optical device encapsulating material.

The present invention also provides an optical device which is encapsulated with a cured product of the encapsulating material.

Accordingly, by obtaining a cured product by using the optical device encapsulating material comprising the addition-curable silicone composition of the present invention, an optical device which is encapsulated with the optical device encapsulating material having high refractive index, transparency, and temperature cycling resistance can be obtained.

Advantageous Effects of Invention

Since the addition-curable silicone composition of the present invention provides a cured product having high refractive index, transparency, and temperature cycling resistance obtained by being cured, it can preferably be used as an optical device encapsulating material.

BRIEF DESCRIPTION OF DRAWINGS

FIG. 1 is a schematic diagram of a cross-sectional view of one example of a light-emitting semiconductor apparatus by preferably using the addition-curable silicone composition of the present invention.

DESCRIPTION OF EMBODIMENTS

Inventor of the present invention has carried out extended research and found that by using a branched organopolysiloxane having a unit comprising $R_2SiO$ and $SiO_2$, wherein R represents an organic group, i.e., a branched organopolysiloxane having a siloxane unit comprising a unit D and a unit Q and not having a unit T ($RSiO_{3/2}$), an addition-curable silicone composition which provides a cured product having high refractive index, transparency, and temperature cycling resistance can be obtained. Based on that information, the present invention was accomplished.

That is, the present invention provides the following addition-curable silicone composition, the optical device encapsulating material and the optical device.
The present invention will be described in detail.
<Addition-Curable Silicone Composition>

As a first aspect, the present invention provides an addition-curable silicone composition comprising:
A. a three-dimensional network organopolysiloxane having at least one alkenyl group and at least one aryl group in one molecule, having a siloxane unit represented by the following general formula,
$R_2SiO$, and $SiO_2$, and not having a unit represented by $RSiO_{3/2}$,
   wherein R represents an organic group;
B. a linear organopolysiloxane having at least two alkenyl groups and at least one aryl group in one molecule;
C. an organosilicon compound having at least two hydrogen atoms bonded to silicon atoms per one molecule, and not having an alkenyl group, in an amount enough to cure the composition in the presence of a hydrosilylation catalyst described below; and
D. the hydrosilylation catalyst containing a platinum group metal.
[Component A]

The component A is a three-dimensional network organopolysiloxane as a component for strengthening a cured product obtained by curing the composition, having at least one silicon atom-bonded alkenyl group and at least one silicon atom-bonded aryl group in one molecule and having a siloxane unit represented by general formula, $R_2SiO$, and $SiO_2$, and not having a unit represented by $RSiO_{3/2}$,
   wherein R represents an organic group.

The component A is an organopolysiloxane having a siloxane unit comprising a unit D and a unit Q and not having a unit T.

In this case, the component A is preferably a three-dimensional network organopolysiloxane represented by the following average composition formula, $$(R^1{}_3SiO_{1/2})_a(R^1{}_2SiO)_b(SiO_2)_c \quad (1)$$

wherein $R^1$ independently represents an organic group; at least 1 mole % of all the $R^1$ is an alkenyl group; at least 10 mole % of all the $R^1$ is an aryl group; "a" represents 0 or a positive number; and "b" and "c" each represent a positive number, satisfying $0.1 \leq$"b"$/(a+b+c) \leq 0.8$, and $0.2 \leq$"c"$/(a+b+c) \leq 0.8$.

Illustrative example of the alkenyl group in the $R^1$ of the formula (1) includes a vinyl group, an allyl group, a butenyl group, a pentenyl group, and hexenyl group, and a vinyl group is particularly preferable. The content of the alkenyl group in the $R^1$ is 1 mole % or more, preferably over 1 mole % and 50 mole % or less, more preferably 3 to 40 mole %, and particularly preferably 5 to 30 mole %. If the content is 1 mole % or more, a composition is sufficiently cured, and if the content is 50 mole % or less, a cured product is not brittle.

Illustrative example of the aryl group in the $R^1$ includes a phenyl group, a tolyl group, a xylyl group, and a naphthyl group, and a phenyl group is particularly preferable. The content of the aryl group in the $R^1$ is 10 mole % or more, preferably 30 mole % or more, more preferably 40 to 99.9 mole %, and particularly preferably 45 to 95 mole %. If the content is 10 mole % or more, it is preferable that the refractive index of a cured product become higher. If the content is 30 mole % or more, the cured product is excellent in refractive index and optical transparency, and crack resistance becomes more excellent.

Illustrative example of a silicon atom-bonded organic group in the $R^1$ other than an alkenyl group and an aryl group includes a substituted or unsubstituted monovalent hydrocarbon group such as an alkyl group such as a methyl group, an ethyl group, a propyl group, a butyl group, a pentyl group, a hexyl group, and a heptyl group; an aralkyl group such as a benzyl group and a phenethyl group; a halogenated alkyl group such as a chloromethyl group, a 3-chloropropyl group, and a 3,3,3-trifluoropropyl group, and a methyl group is particularly preferable.

The molecular weight of the component A is not restricted, but the weight average molecular weight (Mw) by GPC measurement using a THF solvent (equivalent to standard polystyrene) is preferably 500 to 20,000, more preferably 700 to 15,000, and particularly preferably 1,000 to 12,000.

As long as the component A contains no unit T as described above, one type thereof may be used, and two or more types thereof having different molecular weight and type of a silicon atom-bonded organic group, etc., may be used.

[Component B]

The component B is a linear organopolysiloxane having at least two alkenyl groups and at least one aryl group in one molecule as a component for making flexible a cured product obtained by curing the composition.

The component B is preferably a linear organopolysiloxane represented by the following average composition formula, $$(R^2_3SiO_{1/2})_d(R^2_2SiO)_e \qquad (2)$$

wherein $R^2$ independently represents an organic group; at least 0.1 mole % of all the $R^2$ is an alkenyl group; at least 10 mole % of all the $R^2$ is an aryl group; and "d" and "e" each represent a positive number, satisfying $0.001 \leq$ "d"/(d+e)$\leq 0.7$.

Illustrative example of the alkenyl group in the $R^2$ of the formula (2) includes the same functional group as the $R^1$, and a vinyl group is particularly preferable. The content of the alkenyl group in the $R^2$ is 0.1 mole % or more, preferably over 0.1 and 40 mole % or less, more preferably 0.5 to 30 mole %, and particularly preferably 1 to 20 mole %. If the content is 0.1 mole % or more, a composition is sufficiently cured, and if the content is 40 mole % or less, it is preferable that a cured product be not brittle.

Illustrative example of the aryl group in the $R^2$ includes the same functional group as the $R^1$, and a phenyl group is particularly preferable. The content of the aryl group in the $R^2$ is preferably 10 mole % or more, more preferably 30 mole % or more, and particularly preferably 45 to 99 mole %. If the content is 10 mole % or more, it is preferable that the refractive index of a cured product become higher. If the content is 30 mole % or more, the cured product shows higher refractive index and is more excellent in compatibility with the component A.

Illustrative example of a silicon atom-bonded organic group in the $R^2$ other than an alkenyl group and an aryl group includes the same functional group as the $R^1$, and a methyl group is particularly preferable.

The molecular weight of the component B is not restricted, but the weight average molecular weight (Mw) by GPC measurement using a THF solvent (equivalent to standard polystyrene) is preferably 500 to 30,000, more preferably 700 to 20,000, and particularly preferably 1,000 to 10,000.

One type of the component B may be used, and two or more types thereof having different molecular weight and type of a silicon atom-bonded organic group, etc., may be used.

The amount of the component B to be blended is preferably a weight ratio of 0.01 to 100, relative to the component A, more preferably 0.1 to 10, and most preferably 0.2 to 5.

[Component C]

The component C is an organosilicon compound (an SiH group-containing organic compound) having at least two hydrogen atoms bonded to silicon atoms per one molecule (i.e. an SiH group), and not having an aliphatic unsaturated group, and serves as a crosslinking agent by subjecting itself to a hydrosilylation reaction with the components A and B.

The component C is preferably an organopolysiloxane represented by the following average composition formula, $$(R^3_3SiO_{1/2})_f(R^3_2SiO)_g(R^3SiO_{3/2})_h \qquad (3)$$

wherein $R^3$ represents an identical or different organic group or a hydrogen atom other than an alkenyl group; 0.1 to 50 mole % of all the $R^3$ is a hydrogen atom; 10 mole % or more of all the $R^3$ is an aryl group; "f" represents a positive number; and "g" and "h" each represent 0 or a positive number, satisfying $0.01 \leq$ "f"/"g"$\leq 2$, wherein "g" represents a positive number, $0.1 \leq$ "f"/"h"$\leq 3$, wherein "h" represents a positive number, and $0.01 \leq$ "f"/(f+g+h)$\leq 0.75$.

The content of the hydrogen atom in the $R^3$ is 0.1 to 50 mole %, preferably 1 to 40 mole %, and more preferably 10 to 30 mole %. If the content is 0.1 mole % or more, a composition is sufficiently cured, and if the content is 50 mole % or less, a cured product is not brittle.

Illustrative example of the aryl group in the $R^3$ includes the same functional group as the $R^1$, and a phenyl group is particularly preferable. The content of the aryl group in the $R^3$ is preferably 10 mole % or more, more preferably 30 mole % or more, and particularly preferably 45 to 99 mole %. If the content is 10 mole % or more, it is preferable that the refractive index of a cured product become higher. If the content is 30 mole % or more, the cured product shows higher refractive index and is more excellent in compatibility with the components A and B.

Illustrative example of a silicon atom-bonded organic group in the $R^3$ other than a hydrogen atom and an aryl group includes the same functional group as the $R^1$, and a methyl group is particularly preferable.

The molecular weight of the component C is not restricted, but the weight average molecular weight (Mw) by GPC measurement using a THF solvent (equivalent to standard polystyrene) is preferably 100 to 5,000, more preferably 200 to 3,000, and particularly preferably 300 to 1,000.

One type of the component C may be used, and two or more types thereof having different molecular weight and type of a silicon atom-bonded organic group, etc., may be used.

The amount of the component C to be blended is an amount enough to cure the composition in the presence of a hydrosilylation catalyst of a component D. Normally, the molar ratio of an SiH group in the component C is 0.2 to 5, relative to an aliphatic unsaturated group in the components A and B, and preferably 0.5 to 2. The amount of the component C is a mass ratio of 0.01 to 100, relative to the total of the components A and B.

[Component D]

A platinum group metal-based hydrosilylation catalyst of a component D may be any catalyst, as long as a hydrosilylation addition reaction between an aliphatic unsaturated group bonded to a silicon atom in the components A and B and an SiH group in the component C is promoted. The component D may be used as one or more types thereof. Illustrative example of the component D includes a platinum group metal such as platinum, palladium and rhodium, coordination compound of chloroplatinic acid, alcohol-modified chloroplatinic acid, chloroplatinic acid with olefins, vinyl siloxane or acetylene compounds, and a platinum group metal compound such as tetrakis(triphenylphosphine) palladium and chlorotris (triphenylphosphine)rhodium, and particularly preferably a platinum compound.

The amount of the component D to be blended may be an effective amount as a hydrosilylation catalyst, preferably in the range of 0.1 to 1000 ppm in terms of a mass as a platinum group metal element based on the total mass of the components A, B and C, more preferably 1 to 500 ppm.

[Other Components]

The following illustrative other component(s) may be blended into the composition of the present invention other than the above components A to D.

Illustrative example of other components includes a light scattering agent or a reinforcing agent such as crystalline silica; a fluorescent material; a viscosity modifier such as a petroleum solvent, non-reactive silicone oil having no reactive functional group; an adhesion improving agent such as carbon functional silane, a silicone compound other than components A, B and C having at least one type of an epoxy group, an alkoxy group, a hydrogen atom bonded to a silicon atom (i.e. SiH group) and an alkenyl group such as a vinyl group bonded to a silicon atom; and a reaction inhibitor such as 1-ethynyl cyclohexanol.

Other components may be used as one or more types thereof.

[Cured Product]

The silicone composition of the present invention can be cured by a known curing method under known curing conditions. Specifically, by heating the composition normally at 80 to 200° C., preferably at 100 to 160° C., the composition can be cured. The heating duration is about 0.5 minutes to 5 hours, particularly about 1 minute to 3 hours. However, in cases where precision for encapsulating an LED, etc., is required, the curing duration is preferably longer. The type of a cured product obtained is not particularly restricted, and may be any of a gel cured product, an elastomer cured product and a resin cured product. The cured product is normally colorless and transparent, having higher refractive index.

As a second aspect, the present invention provides an optical device encapsulating material comprising the composition.

<Optical Device Encapsulating Material>

Since a cured product of the composition of the present invention is excellent in heat resistance, cold resistance, and electric insulation like a cured product of a normal addition-curable silicone composition and has high refractive index, transparency, and temperature cycling resistance, it is preferably used as an optical device encapsulating material.

As a third aspect, the present invention provides an optical device which is encapsulated with a cured product of the encapsulating material.

<Optical Device>

Illustrative example of the optical device which is encapsulated with an encapsulating material comprising the composition of the present invention includes an LED, a semiconductor laser, a photodiode, a phototransistor, a solar cell, and a CCD. The above optical devices can be encapsulated by coating the optical device with the encapsulating material comprising the composition of the present invention and curing the coated encapsulating material by a known curing method under known curing conditions, concretely as described above.

EXAMPLES

The present invention will be described in detail with reference to the following Preparation Example, Examples and Comparative Examples, but the present invention is not restricted to the following Examples.

In the following examples, the viscosity is a value measured at 25° C. using a rotational viscometer.

In the following examples, the hardness is a value measured at 25° C. using a type-D durometer.

In the following examples, the optical transmittance is a value by measuring the transmittance on a wavelength of 450 nm at 25° C. using a spectrophotometer.

In the following examples, the symbols showing a composition of a silicone oil or a silicone resin is shown as follows. The number of moles of each silicone oil or each silicone resin refers to the number of moles of a vinyl group or a silicon atom-bonded hydrogen atom contained in each component.

$M^H$: $(CH_3)_2HSiO_{1/2}$
$M^{Vi}$: $(CH_2=CH)(CH_3)_2SiO_{1/2}$
$M^{Vi\Phi}$: $(CH_2=CH)(C_6H_5)(CH_3)SiO_{1/2}$
$D^H$: $(CH_3)HSiO_{2/2}$
$D^{Vi}$: $(CH_2=CH)(CH_3)SiO_{2/2}$
$D^\Phi$: $(C_6H_5)(CH_3)SiO_{2/2}$
$D^{2\Phi}$: $(C_6H_5)_2SiO_{2/2}$
$T^\Phi$: $(C_6H_5)SiO_{3/2}$
Q: $SiO_{4/2}$

Preparation Example 1

Preparation of Platinum Catalyst

A platinum catalyst used in this Example is a product obtained by diluting a reaction product of a hexachloroplatinic acid and a sym-tetramethyldivinyldisiloxane with toluene, so that the platinum content is 0.5% by mass (catalyst "a").

Example 1

A silicone resin constituted at a ratio of $D^{Vi}/D^{2\Phi}/Q=20/40/40$, i.e., a silicone resin (31.0 g) (51.4 millimoles) represented by average unit formula,

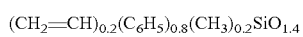

a silicone oil having an $M^{Vi\Phi}{}_2D^{2\Phi}{}_3$ structure (46.5 g) (103 millimoles), a silicone oil having an $M^H{}_2D^{2\Phi}$ structure (22.5 g) (135 millimoles), an epoxy group-containing siloxane compound (0.50 g) (4.2 millimoles) represented by the following structural formula (4) as an adhesion improving agent,

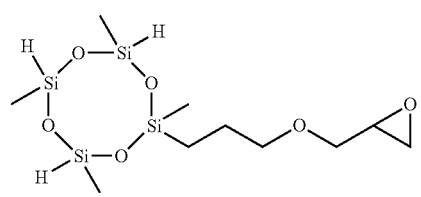

a 1-ethynyl cyclohexanol (0.20 g) as an addition reaction inhibitor, and a catalyst a (0.40 g) were mixed to obtain a silicone composition.

Example 2

A silicone resin constituted at a ratio of $M^{Vi}/D^{2\Phi}/Q=25/37.5/37.5$, i.e., a silicone resin (53.0 g) (110 millimoles) represented by average unit formula,

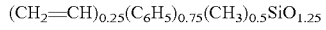

a silicone oil having an $M^{Vi\Phi}{}_2D^{2\Phi}{}_3$ structure (23.0 g) (50.8 millimoles), a silicone oil having an $M^H{}_2D^{2\Phi}$ structure (24.0 g) (144 millimoles), an epoxy group-containing siloxane compound represented by the structural formula (4) (0.50 g) (4.2 millimoles), a 1-ethynyl cyclohexanol (0.20 g), and a catalyst a (0.40 g) were mixed to obtain a silicone composition.

Example 3

A silicone resin constituted at a ratio of $D^{Vi}/D^{2\Phi}/Q=20/40/40$, i.e., a silicone resin represented by average unit formula (15.5 g) (25.7 millimoles), $(CH_2=CH)_{0.2}(C_6H_5)_{0.8}(CH_3)_{0.2}SiO_{1.4}$ a silicone oil having an $M^{Vi\Phi}{}_2D^{2\Phi}{}_3$ structure (61.5 g) (136 millimoles), a silicone oil having an $M^H{}_2D^H{}_2D^{2\Phi}{}_2$ structure (23.0 g) (141 millimoles), an epoxy group-containing siloxane compound represented by the structural formula (4) (0.50 g) (4.2 millimoles), a 1-ethynyl cyclohexanol (0.20 g), and a catalyst a (0.40 g) were mixed to obtain a silicone composition.

Example 4

A silicone resin constituted at a ratio of $D^{Vi}/D^{2\Phi}/Q=20/40/40$, i.e., a silicone resin represented by average unit formula (43.0 g) (71.3 millimoles), $(CH_2=CH)_{0.2}(C_6H_5)_{0.8}(CH_3)_{0.2}SiO_{1.4}$ a silicone oil having an $M^{Vi}{}_2D^{\Phi}{}_{23}$ structure (43.0 g) (25.9 millimoles), a silicone oil having an $M^H{}_2D^{2\Phi}$ structure (14.0 g) (84.2 millimoles), an epoxy group-containing siloxane compound represented by the structural formula (4) (0.50 g) (4.2 millimoles), a 1-ethynyl cyclohexanol (0.20 g), and a catalyst a (0.40 g) were mixed to obtain a silicone composition.

Comparative Example 1

A silicone resin constituted at a ratio of $D^{Vi}/D^{2\Phi}/Q=20/40/40$, i.e., a silicone resin represented by average unit formula (80.5 g) (134 millimoles), $(CH_2=CH)_{0.2}(C_6H_5)_{0.8}(CH_3)_{0.2}SiO_{1.4}$, a silicone oil having an $M^H{}_2D^{2\Phi}$ structure (19.5 g) (117 millimoles), an epoxy group-containing siloxane compound represented by the structural formula (4) (0.50 g) (4.2 millimoles), a 1-ethynyl cyclohexanol (0.20 g), and a catalyst "a" (0.40 g) were mixed to obtain a silicone composition.

Comparative Example 2

A silicone oil having an $M^{Vi\Phi}{}_2D^{2\Phi}{}_3$ structure (76.0 g) (168 millimoles), a silicone oil having an $M^H{}_2D^H{}_2D^{2\Phi}{}_2$ structure (24.0 g) (147 millimoles), an epoxy group-containing siloxane compound represented by the structural formula (4) (0.50 g) (4.2 millimoles), a 1-ethynyl cyclohexanol (0.20 g), and a catalyst a (0.40 g) were mixed to obtain a silicone composition.

Comparative Example 3

A silicone resin constituted at a ratio of $D^{Vi}/T^{\Phi}=20/80$, i.e., a silicone resin represented by average unit formula (31.0 g) (51.4 millimoles), $(CH_2=CH)_{0.2}(C_6H_5)_{0.8}(CH_3)_{0.2}SiO_{1.4}$ a silicone oil having an $M^{Vi\Phi}{}_2D^{2\Phi}{}_3$ structure (46.5 g) (103 millimoles), a silicone oil having an $M^H{}_2D^{2\Phi}$ structure (22.5 g) (135 millimoles), an epoxy group-containing siloxane compound represented by the structural formula (4) (0.50 g) (4.2 millimoles), a 1-ethynyl cyclohexanol (0.20 g), and a catalyst a (0.40 g) were mixed to obtain a silicone composition.

A method for evaluating each silicone composition prepared in the above Examples and Comparative Examples was carried out according to the following procedures.

[Method for Evaluating Physical Properties of Composition]

In each composition, the viscosity, hardness and refractive index when the composition was cured at 150° C. for 4 hours, and the optical transmittance of the composition 1 mm thick were measured. The results are shown in Table 1.

[Method for Testing Temperature Cycling Resistance]

Light-Emitting Semiconductor Package

A light-emitting semiconductor apparatus shown in FIG. 1, having an LED chip having a luminescent layer comprising an InGaN and exhibiting a main luminescence peak of 470 nm, was used as a light-emitting device. A light-emitting device 2 was fixed on a housing 1 having a pair of lead electrodes 3, 4 by using a die bond material 5. After the light-emitting device 2 and the lead electrodes 3, 4 were connected by a gold wire 6, an encapsulating resin 7 was potted and cured at 150° C. for 4 hours to produce a light-emitting semiconductor apparatus 8.

10 light-emitting semiconductor apparatuses produced were fed into an infrared reflow apparatus at 260° C. three times. Thereafter, the temperature was risen and lowered between −40° C. and 125° C. Temperature cycle was performed 100 times, each for 15 minutes. A change in appearance was observed, and confirmation of resin crack or peeling from an LED package was counted as NG. The results are shown in Table 1.

TABLE 1

| | Example 1 | Example 2 | Example 3 | Example 4 | Comparative Example 1 | Comparative Example 2 | Comparative Example 3 |
|---|---|---|---|---|---|---|---|
| Viscosity (mPa · s) | 1,500 | 1,200 | 1,400 | 12,000 | >100,000 | 470 | 1,600 |
| Hardness (type D) | 38 | 28 | 40 | 27 | 80 | 30 | 40 |
| Reflective index | 1.57 | 1.56 | 1.58 | 1.56 | 1.57 | 1.58 | 1.57 |
| Optical transmittance (%) | 90 | 90 | 90 | 90 | 89 | 90 | 90 |
| Temperature cycling test Number of NG/Number of tests | 0/10 | 0/10 | 0/10 | 0/10 | 10/10 | 6/10 | 4/10 |

As shown in Table 1, each composition obtained is found to have higher refractive index and higher transparency and be resistant to a temperature cycling test by meeting the conditions of the present invention. On the other hand, Comparative Examples 1 and 2 using no component A or B readily showed NG during a temperature cycling test. In addition, as shown in Comparative Example 3, when a conventionally employed silicone resin containing unit T, in place of a component A, was used, temperature cycling resistance obviously deteriorated.

It must be stated here that the present invention is not restricted to the embodiments shown by Examples. The embodiments shown by Examples are merely examples so that any embodiments consisting of substantially the same technical concept as disclosed in the claims of the present invention and expressing a similar effect are included in the technical scope of the present invention.

The invention claimed is:

1. An addition-curable silicone composition comprising:
   A. a three-dimensional network organopolysiloxane having at least one alkenyl group and at least one aryl group in one molecule, having a siloxane unit represented by the following general formula, $R_2SiO$, and $SiO_2$, and not having a unit represented by $RSiO_{3/2}$,
   wherein R represents an organic group;
   B. a linear organopolysiloxane having at least two alkenyl groups and at least one aryl group in one molecule;
   C. an organosilicon compound having at least two hydrogen atoms bonded to silicon atoms per one molecule, and not having an alkenyl group, in an amount enough to cure the composition in the presence of a hydrosilylation catalyst described below; and
   D. the hydrosilylation catalyst containing a platinum group metal.

2. The addition-curable silicone composition according to claim 1, wherein the component A is a three-dimensional network organopolysiloxane represented by the following average composition formula,

   (1)

wherein $R^1$ independently represents an organic group; at least 1 mole % of all the $R^1$ is an alkenyl group; at least 10 mole % of all the $R^1$ is an aryl group; "a" represents 0 or a positive number; and "b" and "c" each represent a positive number, satisfying $0.1 \leq "b"/(a+b+c) \leq 0.8$, and $0.2 \leq "c"/(a+b+c) \leq 0.8$.

3. The addition-curable silicone composition according to claim 2, wherein the component B is a linear organopolysiloxane represented by the following average composition formula,

   (2)

wherein $R^2$ independently represents an organic group; at least 0.1 mole % of all the $R^2$ is an alkenyl group; at least 10 mole % of all the $R^2$ is an aryl group; and "d" and "e" each represent a positive number, satisfying $0.001 \leq "d"/(d+e) \leq 0.7$.

4. The addition-curable silicone composition according to claim 3, wherein the component C is an organopolysiloxane represented by the following average composition formula,

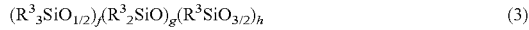   (3)

wherein:
$R^3$ represents an identical or different organic group or a hydrogen atom other than an alkenyl group; 0.1 to 50 mole % of all the $R^3$ is a hydrogen atom; 10 mole % or more of all the $R^3$ is an aryl group; "f" represents a positive number; and "g" and "h" each represent 0 or a positive number;
$0.01 \leq "f"/(f+g+h) \leq 0.75$ is satisfied;
in a case where "g" represents a positive number, $0.01 \leq "f"/"g" \leq 2$ is satisfied; and
in a case where "h" represents a positive number, $0.1 \leq "f"/"h" \leq 3$ is satisfied.

5. The addition-curable silicone composition according to claim 4, wherein the amount of the component B is a mass ratio of 0.01 to 100, relative to the component A, and the amount of the component C is a mass ratio of 0.01 to 100, relative to the total of the components A and B.

6. The addition-curable silicone composition according to claim 3, wherein the amount of the component B is a mass ratio of 0.01 to 100, relative to the component A, and the amount of the component C is a mass ratio of 0.01 to 100, relative to the total of the components A and B.

7. The addition-curable silicone composition according to claim 2, wherein the component C is an organopolysiloxane represented by the following average composition formula,

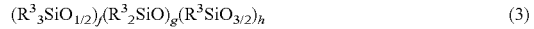   (3)

wherein:
$R^3$ represents an identical or different organic group or a hydrogen atom other than an alkenyl group; 0.1 to 50 mole % of all the $R^3$ is a hydrogen atom; 10 mole % or more of all the $R^3$ is an aryl group; "f" represents a positive number; and "g" and "h" each represent 0 or a positive number;
$0.01 \leq "f"/(f+g+h) \leq 0.75$ is satisfied;
in a case where "g" represents a positive number, $0.01 \leq "f"/"g" \leq 2$ is satisfied; and
in a case where "h" represents a positive number, $0.1 \leq "f"/"h" \leq 3$ is satisfied.

8. The addition-curable silicone composition according to claim 7, wherein the amount of the component B is a mass ratio of 0.01 to 100, relative to the component A, and the amount of the component C is a mass ratio of 0.01 to 100, relative to the total of the components A and B.

9. The addition-curable silicone composition according to claim 2, wherein the amount of the component B is a mass ratio of 0.01 to 100, relative to the component A, and the amount of the component C is a mass ratio of 0.01 to 100, relative to the total of the components A and B.

10. The addition-curable silicone composition according to claim 1, wherein the component B is a linear organopolysiloxane represented by the following average composition formula,

   (2)

wherein $R^2$ independently represents an organic group; at least 0.1 mole % of all the $R^2$ is an alkenyl group; at least 10 mole % of all the $R^2$ is an aryl group; and "d" and "e" each represent a positive number, satisfying $0.001 \leq "d"/(d+e) \leq 0.7$.

11. The addition-curable silicone composition according to claim 10, wherein the component C is an organopolysiloxane represented by the following average composition formula,

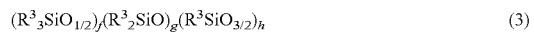   (3)

wherein:
$R^3$ represents an identical or different organic group or a hydrogen atom other than an alkenyl group; 0.1 to 50 mole % of all the $R^3$ is a hydrogen atom; 10 mole % or more of all the $R^3$ is an aryl group; "f"

represents a positive number; and "g" and "h" each represent 0 or a positive number;

0.01≤"f"/(f+g+h)≤0.75 is satisfied;

in a case where "g" represents a positive number, 0.01≤"f"/"g"≤2 is satisfied; and in a case where "h" represents a positive number, 0.1≤"f"/"h"≤3 is satisfied.

12. The addition-curable silicone composition according to claim 11, wherein the amount of the component B is a mass ratio of 0.01 to 100, relative to the component A, and the amount of the component C is a mass ratio of 0.01 to 100, relative to the total of the components A and B.

13. The addition-curable silicone composition according to claim 10, wherein the amount of the component B is a mass ratio of 0.01 to 100, relative to the component A, and the amount of the component C is a mass ratio of 0.01 to 100, relative to the total of the components A and B.

14. The addition-curable silicone composition according to claim 1, wherein the component C is an organopolysiloxane represented by the following average composition formula, $$(R^3{}_3SiO_{1/2})_f(R^3{}_2SiO)_g(R^3SiO_{3/2})_h \quad (3)$$

wherein:

R$^3$ represents an identical or different organic group or a hydrogen atom other than an alkenyl group; 0.1 to 50 mole % of all the R$^3$ is a hydrogen atom; 10 mole % or more of all the R$^3$ is an aryl group; "f" represents a positive number; and "g" and "h" each represent 0 or a positive number;

0.01≤"f"/(f+g+h)≤0.75 is satisfied;

in a case where "g" represents a positive number, 0.01≤"f"/"g"≤2 is satisfied; and in a case where "h" represents a positive number, 0.1≤"f"/"h"≤3 is satisfied.

15. The addition-curable silicone composition according to claim 14, wherein the amount of the component B is a mass ratio of 0.01 to 100, relative to the component A, and the amount of the component C is a mass ratio of 0.01 to 100, relative to the total of the components A and B.

16. The addition-curable silicone composition according to claim 1, wherein the amount of the component B is a mass ratio of 0.01 to 100, relative to the component A, and the amount of the component C is a mass ratio of 0.01 to 100, relative to the total of the components A and B.

17. An optical device encapsulating material comprising the composition according to claim 1.

18. An optical device which is encapsulated with a cured product of the encapsulating material according to claim 17.

* * * * *